US 7,086,453 B2

(12) United States Patent
Lee et al.

(10) Patent No.: US 7,086,453 B2
(45) Date of Patent: Aug. 8, 2006

(54) INTEGRATED LIQUID COOLING SYSTEM FOR ELECTRICAL COMPONENTS

(75) Inventors: Hsieh Kun Lee, Tu-Chen (TW); Chun-Chi Chen, Tu-chen (TW); Jianjun Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/920,873

(22) Filed: Aug. 17, 2004

(65) Prior Publication Data

US 2005/0056404 A1 Mar. 17, 2005

(30) Foreign Application Priority Data

Sep. 12, 2003 (TW) .............................. 92216480 U

(51) Int. Cl.
*F28F 7/00* (2006.01)
*H05K 7/20* (2006.01)

(52) U.S. Cl. .............................. 165/80.4; 165/104.33; 361/699

(58) Field of Classification Search ............... 165/80.4, 165/80.3, 80.5, 104.33, 104.34, 185; 361/698, 361/699, 697; 257/714
See application file for complete search history.

(56) References Cited

U.S. PATENT DOCUMENTS 3,817,321 A * 6/1974 Von Cube et al. ...... 165/104.22
5,203,399 A * 4/1993 Koizumi ................. 165/104.33
5,406,807 A * 4/1995 Ashiwake et al. ............ 62/376
6,005,772 A * 12/1999 Terao et al. ................. 361/699
6,263,957 B1 7/2001 Chen et al.
6,382,306 B1 * 5/2002 Hsu .......................... 165/80.3
6,591,898 B1 * 7/2003 Chu et al. .................. 165/80.4
6,600,649 B1 * 7/2003 Tsai et al. ................... 361/697
6,688,377 B1 * 2/2004 Wang .................... 165/104.26
6,819,564 B1 * 11/2004 Chung et al. ............... 361/697
2003/0230398 A1* 12/2003 Lee et al. .............. 165/104.21

FOREIGN PATENT DOCUMENTS

CN ZL98248834.3 11/1999
CN ZL99210734.2 4/2000

* cited by examiner

*Primary Examiner*—Tho Duong
(74) *Attorney, Agent, or Firm*—Wei Te Chung

(57) ABSTRACT

A liquid cooling system includes a cooling body (10), and a liquid circulation module (20). The cooling body comprises a cooling base (11) for thermally contacting a heat source, and a heat sink (14) mounted on the cooling base. An internal flow path is defined in the cooling body, for heat exchange with coolant. At least two passages (15) are formed through the heat sink. The liquid circulation module defines a plurality of external flow paths coupled to the internal flow path of the cooling base, thereby forming a loop for circulation of the coolant. The external flow paths comprises at least two output paths extending through the at least two passages of the heat sink, and along which the coolant that exits the internal flow path passes through the heat sink for cooling.

8 Claims, 2 Drawing Sheets

INTEGRATED LIQUID COOLING SYSTEM FOR ELECTRICAL COMPONENTS

BACKGROUND OF THE INVENTION

1. Field of the Invention

The present invention relates generally to cooling systems, and more particularly to a liquid cooling system for rapidly cooling an electrical component such as a Central Processing Unit (CPU).

2. Related Art

With the continuing development of computer electronics technology, new electronic packages such as the latest CPUs can perform more and more functions. Heat generated by these modem electronic packages has increased commensurately. The heat must be removed from the CPUs to prevent them becoming unstable or being damaged. The traditional cooling means such as combined heat sinks and cooling fans are increasingly unable to provide satisfactory cooling performance. Under such circumstances, cooling system using liquid cooling technology is thus developed for cooling the CPUs.

Chinese patent numbers 98248834.3 and 99210734.2 respectively disclose such a kind of cooling system. This kind of cooling system generally comprises a cooling base contact the CPU for absorbing heat generated by the CPU. The cooling base generally defines a cavity for receiving liquid coolant therein, and an inlet and an outlet both in communication with the cavity. The cooling system also comprises a heat sink and a pump arranged at proper places within a computer enclosure. A first tube connects the inlet of the cooling base and the pump, so that the coolant enters the cavity along the first tube. A second tube connects the outlet of the cooling base and the pump, so that the heated coolant exits from the cavity along the second tube. The second tube extends through the heat sink, whereupon heat of the heated coolant is transferred to the heat sink to radiate to ambient air. Thus, the heat of the CPU is continuously taken away by circulation of the coolant.

However, the cooling base, the tubes, the heat sink, and the pump are discrete components prior to attachment within the computer enclosure. Installation and removal of the cooling system can be troublesome and problematic. In addition, a large space for these discrete components is required. This militates against the trend of electrical devices becoming more and more smaller. Further, the coolant generally can not be completely cooled by passing the heat sink, due to a small contact area between the tube and the heat sink.

SUMMARY OF THE INVENTION

Accordingly, an object of the present invention is to provide a liquid cooling system which has an enhanced cooling performance.

Another object of the present invention is to provide a liquid cooling system which can be readily installed or removed to or from an electrical enclosure.

To achieve the above-mentioned objects, a liquid cooling system in accordance with a preferred embodiment of the present invention comprises a cooling body, and a liquid circulation module. The cooling body comprises a cooling base for thermally contacting a heat source, and a heat sink mounted on the cooling base. An internal flow path is defined in the cooling body, for heat exchange with coolant. At least two passages are formed through the heat sink. The liquid circulation module defines a plurality of external flow paths coupled to the internal flow path of the cooling base, thereby forming a loop for circulation of the coolant. The external flow paths comprises at least two output paths extending through the at least two passages of the heat sink, and along which the coolant that exits the internal flow path passes through the heat sink for cooling.

Other objects, advantages and novel features of the present invention will be drawn from the following detailed description of the preferred embodiment of the present invention with attached drawings, in which:

DESCRIPTION OF THE PREFERRED EMBODIMENT

Figure 1:
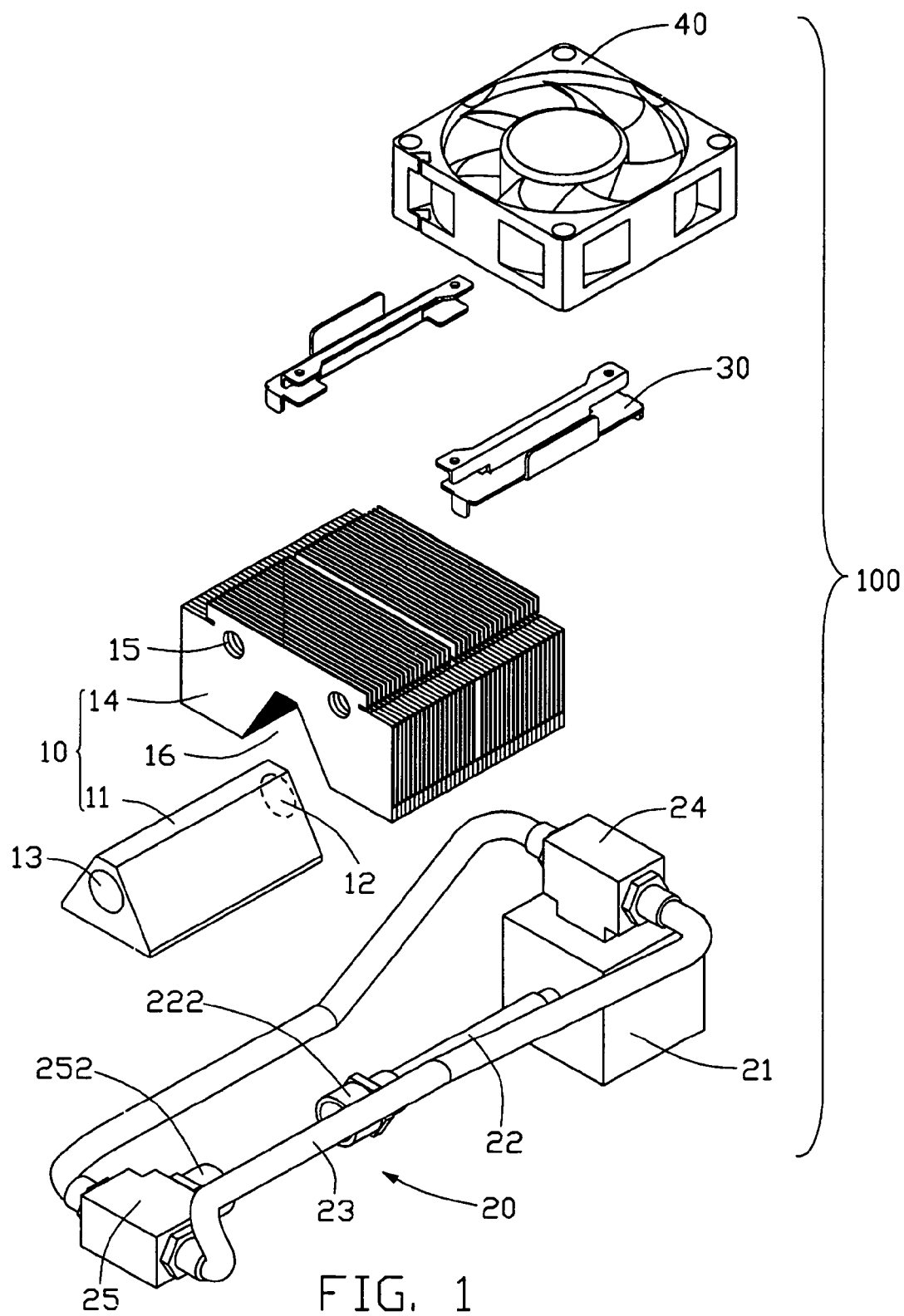
FIG. 1 is an exploded, isometric view of a liquid cooling system in accordance with the preferred embodiment of the present invention.
Figure 2:
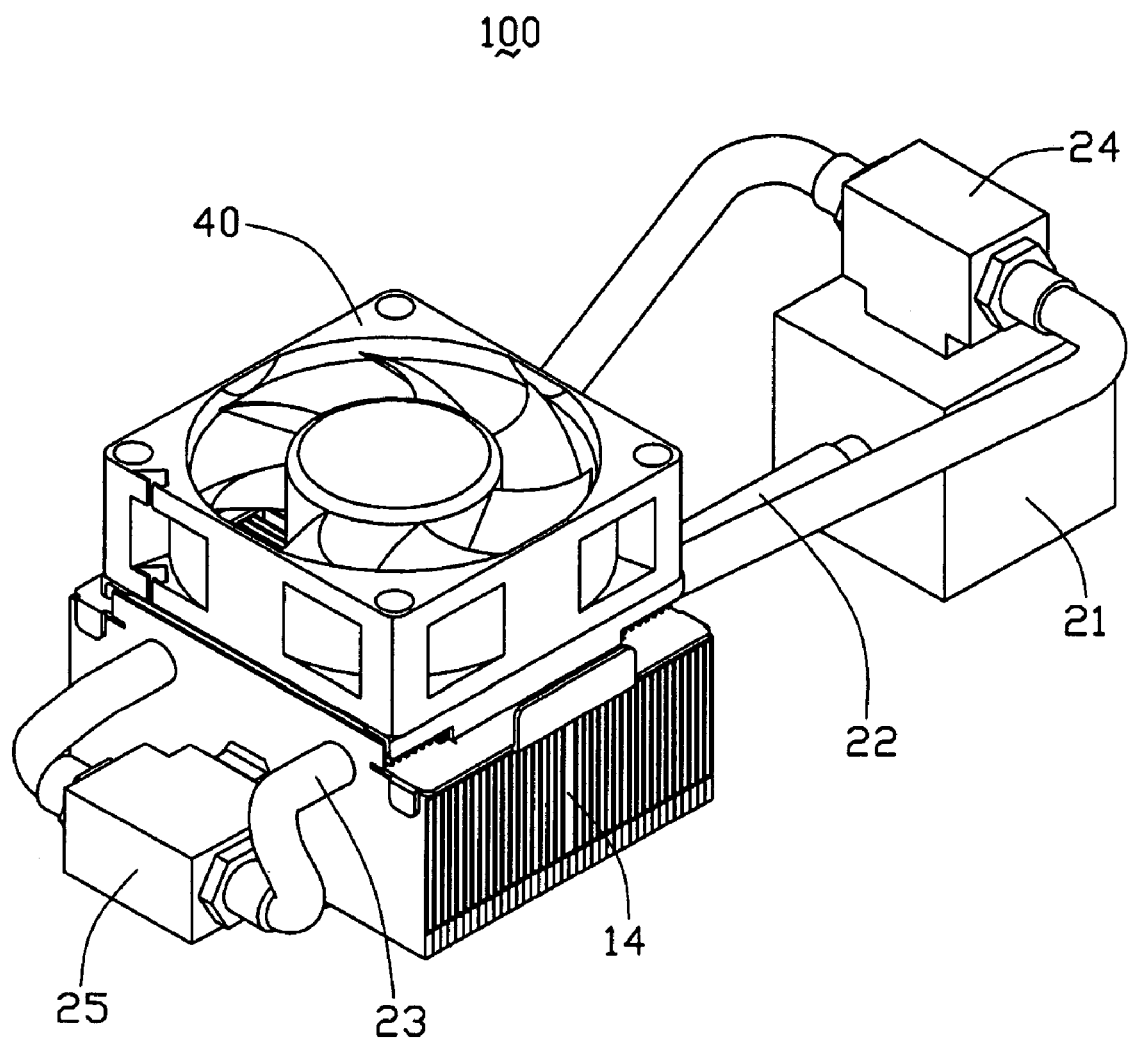
FIG. 2 is an assembled, isometric view of the liquid cooling system of FIG. 1.

Referring to FIGS. 1 and 2, a liquid cooling system 100 in accordance with a preferred embodiment of the present invention comprises a cooling body 10, a liquid circulation module 20 coupled to the cooling body 10, and a fan 40 mounted on the cooling body 10.

The cooling body 10 comprises a cooling base 11 for thermally contacting a heat generating component (not shown), and a heat sink 14 mounted on the cooling base 11. The cooling base 11 has a trapezoid cross section with a top side being smaller than a bottom side thereof. The bottom side is used to absorb the heat of the heat generating component. The cooling base 11 defines therein an internal flow path for flow of coolant for heat exchange. An inlet 12 and an outlet 13 are formed at opposite ends of the cooling base 11, both in communication with the internal flow path. Thus, the coolant can enter the internal flow path via the inlet 12, and exit the internal flow path via the outlet 13.

The heat sink 14 comprises a plurality of parallel plate-like cooling fins (not labeled) connected with each other. Each cooling fin defines a pair of through holes at a top portion thereof, and a trapezoid cutout at an underside thereof. When the cooling fins are assembled together, the through holes align with each other thereby cooperatively form a pair of passages 15 extending through the heat sink 14, and the cutouts align with each other thereby cooperatively form a groove 16 extending through the heat sink 14. The groove 16 corresponds to an outer profile of the cooling base 11, so that the heat sink 14 can be mounted to the cooling base 11 at the groove 16 by a variety of suitable means, such as soldering, adhesive and so on.

The fan 40 is mounted on the heat sink 14 by a pair of mounting brackets 30.

The liquid circulation module 20 mainly comprises a pump 21, and a plurality of pipes attached thereto. A plurality of external flow paths is defined by the pipes, for being coupled to the internal flow path to form a closed loop for circulation of the coolant.

The pipes comprise an input pipe 22, and a pair of output pipes 23. The input pipe 22 is connected between the pump 21 and the inlet 12 of the cooling base 11, for feeding the coolant to the internal flow path of the cooling base 11. The output pipes 23 are connected between the pump 21 and the outlet 13 of the cooling base 11 and extend through the passages 15 of the heat sink 14 respectively, for guiding the coolant through the passages 15 for heat exchange, and then back to the pump 21 when the coolant exits the internal flow path of the cooling base 11.

To connect the output pipes 23 to the outlet 13 of the cooling base 11, a diverging member 25 is attached to the cooling base 11 at the outlet 13, and the output pipes 23 are attached to the diverging member 25. The diverging member 25 serves to subdivide the coolant into two branches to flow into respective output pipes 23. To connect the output pipes 23 to the pump 21, a converging member 24 is attached to the pump 21, and the output pipes 23 are attached to the converging member 24. The converging member 24 serves to converge the coolant at the pump 21.

In operation of the liquid cooling system, the cooling base 11 takes away the heat of the heat generating component. The coolant fed by the input pipe 22 into the internal flow path via the inlet 12 absorbs the heat of the cooling base 11. Then the heated coolant exits the internal flow path via the outlet 13 and flows along the output pipes 23 into the respective passages 15 of the heat sink 14 for cooling, and back to the pump for a next circle. Thus, circulation of the coolant can continuously take away the heat of the heat generating component.

In the present invention, the coolant passing through the heat sink 14 is subdivided into two branches. This enhances the heat exchange area between the heat sink 14 and the output pipes 23, and thus enhances the cooling performance. In addition, the heat sink 14 is mounted on the cooling base 11. Therefore, a great space for assembly and disassembly of the liquid cooling system is not required, and the assembly and disassembly of the liquid cooling system is also simplified.

In the preferred embodiment, the coolant exiting the cooling base 11 is subdivided into two branches. In alternative embodiments, the coolant is subdivided into more than two branches. In this case, the heat sink 14 should form a commensurate number of passages 15.

It is understood that the invention may be embodied in other forms without departing from the spirit thereof. The above-described walled examples and embodiments are to be considered in all respects as illustrative and not restrictive, and the invention is not to be limited to the details given above.

The invention claimed is:

1. A liquid cooling system comprising:
   a cooling body comprising a cooling base for thermally contacting a heat source, and a heat sink mounted on the cooling base, the cooling body defining an internal flow path for heat exchange with coolant, the heat sink forming at least two passages therethrough; and
   a liquid circulation module defining a plurality of external flow paths coupled to said internal flow path thereby for forming a loop for circulation of the coolant, said external flow paths comprising at least two output paths extending through the at least two passages, and along which the coolant that exits said internal flow path passes through the heat sink for cooling;
   wherein the heat sink comprises a plurality of cooling fins connected together; and
   wherein each of the cooling fins defines a cutout therein, and the cutouts cooperatively form a groove corresponding to an outer profile of the cooling base, the cooling fins being mounted to the cooling base at the groove.

2. The liquid cooling system as described in claim 1, wherein the cooling base has a trapezoid cross section.

3. A liquid cooling system comprising:
   a cooling body comprising a cooling base for thermally contacting a heat source, and a heat sink mounted on the cooling base, the cooling body defining an internal flow path for heat exchange with coolant, the heat sink forming at least two passages therethrough; and
   a liquid circulation module defining a plurality of external flow paths coupled to said internal flow path thereby for forming a loop for circulation of the coolant, said external flow paths comprising at least two output paths extending through the at least two passages, and along which the coolant that exits said internal flow path passes through the heat sink for cooling;
   wherein the cooling base defines an inlet and an outlet in communication with said internal flow path, the liquid circulation module comprises a pump for driving the coolant therein, an input pipe connected between the pump and the inlet for feeding the coolant to the internal flow path, and at least two output pipes connected the pump and the outlet for guiding the coolant back to the pump.

4. The liquid cooling system as described in claim 3, wherein the liquid circulation module further comprises a diverging member attached at the outlet for subdividing the coolant into at least two branches.

5. The liquid cooling system as described in claim 3, wherein the liquid circulation module further comprises a converging member attached to the pump for converging the coolant at the pump.

6. The liquid cooling system as described in claim 3, further comprising a fan mounted to the heat sink.

7. A liquid cooling system comprising:
   a pump to which an input pipe is connected;
   a heat sink comprising a plurality of cooling fins, and defining a passage and a groove perpendicularly extending through the cooling fins;
   a cooling base thermally attached in the groove, the cooling base being for thermally contacting a heat source, and defining an internal flow path communicating with the input pipe at one end thereof; and
   an output pipe communicating with the internal flow path at an opposite end thereof, extending through the passage, and connected to the pump; wherein the input pipe, the internal flow path, and the output pipe together forms a loop for circulation of coolant.

8. The liquid cooling system as described in claim 7, further comprising a fan mounted on the heat sink.

* * * * *